United States Patent
Chen et al.

(10) Patent No.: US 8,199,578 B2
(45) Date of Patent: Jun. 12, 2012

(54) SINGLE POLYSILICON LAYER NON-VOLATILE MEMORY AND OPERATING METHOD THEREOF

(75) Inventors: Hsin-Ming Chen, Hsinchu (TW); Shih-Chen Wang, Taipei (TW); Wen-Hao Ching, Hsinchu County (TW); Yen-Hsin Lai, Taipei (TW); Ching-Sung Yang, Hsinchu (TW)

(73) Assignee: eMemory Technology Inc., Hsinchu (TW)

( * ) Notice: Subject to any disclaimer, the term of this patent is extended or adjusted under 35 U.S.C. 154(b) by 231 days.

(21) Appl. No.: 12/792,746

(22) Filed: Jun. 3, 2010

(65) Prior Publication Data
US 2011/0299336 A1 Dec. 8, 2011

(51) Int. Cl.
*G11C 16/04* (2006.01)
*H01L 29/788* (2006.01)
(52) U.S. Cl. ........... 365/185.14; 365/185.1; 365/185.15; 257/316; 257/318
(58) Field of Classification Search ............. 365/185.14
See application file for complete search history.

(56) References Cited

U.S. PATENT DOCUMENTS

| | | | |
|---|---|---|---|
| 5,811,852 A * | 9/1998 | Ling | 257/315 |
| 6,064,595 A * | 5/2000 | Logie et al. | 365/185.18 |
| 6,678,190 B2 | 1/2004 | Yang et al. | |
| 7,593,261 B2 * | 9/2009 | Park et al. | 365/185.05 |
| 2007/0237004 A1* | 10/2007 | Whiston et al. | 365/185.29 |
| 2009/0267127 A1* | 10/2009 | Chen et al. | 257/314 |
| 2010/0032744 A1* | 2/2010 | Mitros et al. | 257/316 |

* cited by examiner

*Primary Examiner* — Son Mai
(74) *Attorney, Agent, or Firm* — Jianq Chyun IP Office (57) ABSTRACT

A single-polysilicon layer non-volatile memory having a floating gate transistor, a program gate and a control gate is provided. The floating gate transistor has a floating gate and a tunneling dielectric layer. The floating gate is disposed on a substrate. The tunneling dielectric layer is disposed between the floating gate and the substrate. The program gate, the control gate and the erase gate are respectively disposed in the substrate under the floating gate separated by the tunneling dielectric layer. Therefore, during a program operation and an erase operation, charges are injected in and expelled out through different regions of the tunneling dielectric layer, so as to increase reliability of the non-volatile memory.

15 Claims, 8 Drawing Sheets

SINGLE POLYSILICON LAYER NON-VOLATILE MEMORY AND OPERATING METHOD THEREOF

BACKGROUND OF THE INVENTION

1. Field of the Invention

The present invention relates to a semiconductor device. More particularly, the present invention relates to a single-polysilicon layer non-volatile memory string having a single-layer polysilicon floating gate and an operating method thereof.

2. Description of Related Art

When semiconductor fabrication process enters a domain of deep sub-micron, sizes of devices become smaller, so that regarding a memory device, sizes of memory cells thereof become more and more smaller. On the other hand, as data required to be processed and stored by information electronic products (such as computers, mobile phones, digital cameras or personal digital assistants (PDA)) are gradually increased, memory volumes required by these information electronic products become greater. Regarding the situation that the memory size becomes smaller and the memory volume is required to be increased, to fabricate a memory device with a small size, a high integrity and a high quality is a common object for the semiconductor industry.

Since a non-volatile memory device has an advantage of still maintaining stored data even if the power is cut off, it becomes a memory device widely used by personal computers and electronic equipments.

In a typical non-volatile memory device, doped polysilicon is used to fabricate a floating gate and a control gate to form a stacked structure. Dielectric layers are respectively disposed between the floating gate and a substrate, and between the floating gate and the control gate.

However, multiple polysilicon layers and multiple dielectric layers are required to be formed in the above non-volatile memory. During the fabrication process, a plurality of mask processes is performed, so that a fabrication flow is prolonged, and a fabrication cost thereof is increased.

A U.S. Pat. No. 6,678,190 discloses a non-volatile memory, in which it is unnecessary to form the multiple polysilicon layers, and two connected P-type metal-oxide semiconductor transistors disposed on N-well respectively serve as a select transistor and a floating gate transistor. Since only a single layer of polysilicon is required, a fabrication process of such non-volatile memory can be integrated with a complementary metal-oxide semiconductor transistor, so as to reduce the fabrication cost.

However, in the non-volatile memory disclosed by the U.S. Pat. No. 6,678,190, since one of the P-type metal-oxide semiconductor transistors has to serve as the select transistor, a size of the memory cell cannot be further reduced.

However, with the development of the integrated circuit industry, fabricating smaller products with a higher speed becomes the general object in this field. Therefore, the integration of the memory device certainly will be increased continuously.

However, the reduced line width often causes the short channel effect, which results in the drop of the threshold voltage (Vt) of the device and poor controlling of the gate voltage (Vg) to the memory cell, and besides, the hot electron effect also occurs, as the channel size is reduced, thus adversely influencing the operation of the memory device. All the problems cause misjudgement of the data by the memory, thus reducing the reliability of the memory. Therefore, it can be seen that, how to form a memory with high integration and high reliability has become an urgent problem to be solved.

SUMMARY OF THE INVENTION

Accordingly, the present invention is directed to a single-polysilicon layer non-volatile memory, in which setting of a select transistor is unnecessary to make a memory array more compact, so that sizes of memory cells can be reduced. To eliminate the select transistor of a memory cell, the electrical array operating methods will be re-designed to fulfil the memory array's purpose accordingly.

The present invention is directed to a single-polysilicon layer non-volatile memory, in which a program gate, a control gate and erase gate are respectively disposed in a substrate under a floating gate separated by a tunneling dielectric layer, so that during a program operation and an erase operation, charges are injected in and expelled out through different regions of the tunneling dielectric layer, so as to increase reliability of the non-volatile memory after the cycling stress.

The present invention is directed to an operating method of a single-polysilicon layer non-volatile memory, by which a program operation and an erase operation can be performed according to a Fowler-Nordheim (F-N) tunneling effect, so that memory cells are less affected by a short-channel effect, so as to reduce an operation voltage and reduce a device size under the fixed coupling ratio condition.

The present invention provides a single-polysilicon layer non-volatile memory having a plurality of memory cell rows, a plurality of program lines, a plurality of control lines, a plurality of erase lines and isolation structure. The memory cell rows are disposed on a substrate to form a memory cell array, and each of the memory cell rows includes a plurality of memory cells connected in series. Each of the memory cells has a floating gate transistor, a program gate and a control gate. The floating gate transistor has a floating gate and a tunneling dielectric layer disposed between the floating gate and the substrate. The program gate and the control gate are respectively disposed in the substrate under the floating gate separated by the tunneling dielectric layer. The program lines are respectively coupled to the program gates of the memory cells of a same row. The control lines are respectively coupled to the control gates of the memory cells of a same column. The erase lines are respectively formed by a well region under each of the memory cell rows. The isolation structure is disposed in the substrate to define a first active region, a second active region and a third active region, and the floating gate crosses the first active region, the second active region and the third active region. Wherein, a source region and a drain region of the floating gate transistor are respectively disposed in the first active region of the substrate located at two sides of the floating gate. The program gate is disposed in the second active region. The control gate is disposed in the third active region. The floating gate transistor is a P-channel transistor. The program gate and the control gate are respectively an N-type well region.

In an embodiment of the present invention, a gate capacitive area between the control gate and the floating gate is greater than a sum of a gate capacitive area between the program gate and the floating gate and a gate capacitive area between the first active region and the floating gate.

In an embodiment of the present invention, a gate capacitive area between the control gate and the floating gate is 10 times greater than a sum of a gate capacitive area between the program gate and the floating gate and a gate capacitive area between the first active region and the floating gate.

In an embodiment of the present invention, the source/drain regions disposed between memory cells in the memory cell row are all floating.

In an embodiment of the present invention, the program lines are arranged perpendicular to the control lines.

In an embodiment of the present invention, the program lines are arranged parallel to erase lines.

In an embodiment of the present invention, the non-volatile memory includes a dielectric layer disposed on top of floating gate to improve charge retention issue.

In an embodiment of the present invention, the dielectric layer is a self-aligned salicide block oxide (SAB) or a resistive protection oxide layer (RPO).

The present invention provides an operating method of a single-polysilicon layer non-volatile memory, which is adapted to the non-volatile memory. The method can be described as follows. During a program operation, a first voltage is applied to a selected control line coupled to a selected memory cell, and a second voltage is applied to a selected program line coupled to the selected memory cell, wherein a voltage difference between the first voltage and the second voltage is great enough to cause an F-N tunneling effect, so that charges enter the floating gate from the program gate.

In an embodiment of the present invention, the voltage difference between the first voltage and the second voltage is about 8 volts to 12 volts.

In an embodiment of the present invention, the operating method of the non-volatile memory further includes following steps. During a program operation, a third voltage is applied to other unselected control lines, and a fourth voltage is applied to other unselected program lines, wherein a voltage difference between the third voltage and the fourth voltage is not great enough to cause the significant F-N tunneling effect.

In an embodiment of the present invention, the operating method of the non-volatile memory further includes following steps. During an erase operation, a fifth voltage is applied to the erase lines, and a sixth voltage is applied to the selected control line coupled to the selected memory cell, wherein a voltage difference between the fifth voltage and the sixth voltage is great enough to cause the F-N tunneling effect, so that charges are expelled to the erase lines from the floating gate.

In an embodiment of the present invention, the voltage difference between the fifth voltage and the sixth voltage is about 8 volts to 12 volts.

In an embodiment of the present invention, the operating method of the non-volatile memory further includes following steps. During the erase operation, a seventh voltage is applied to other unselected control lines, wherein a voltage difference between the fifth voltage and the seventh voltage is not great enough to cause the significant F-N tunneling effect.

In an embodiment of the present invention, the operating method of the non-volatile memory further includes following steps. During a read operation, an eighth voltage is applied to the selected control line coupled to the selected memory cell, a ninth voltage is applied to other unselected control lines, and a tenth voltage is applied to the selected erase line coupled to the selected memory cell, so as to read the selected memory cell.

According to the above descriptions, in the non-volatile memory and the operating method thereof, since it is unnecessary to set a select transistor, sizes of the memory cells can be reduced. Moreover, in the non-volatile memory of the present invention, during the program operation and the erase operation, charges are injected in and expelled out through different regions of the tunneling dielectric layer, so as to increase reliability of the non-volatile memory.

Moreover, in the non-volatile memory of the present invention, the F-N tunneling effect can be used to perform the program operation and the erase operation, so that memory cells are less affected by a short-channel effect, so as to reduce an operation voltage and reduce a device size.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
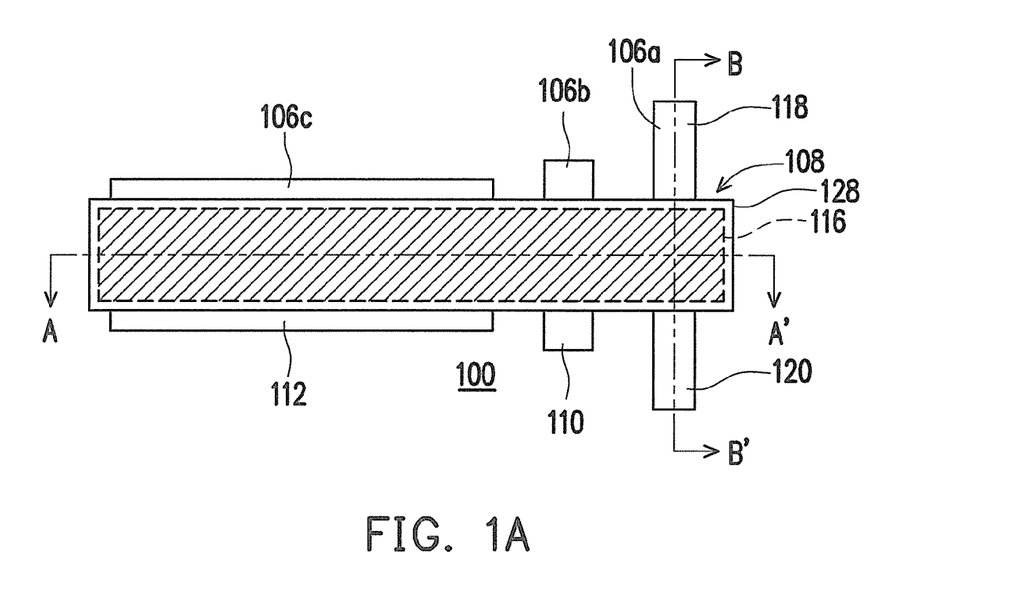
FIG. 1A is a top view of a single-polysilicon layer non-volatile memory cell according to an exemplary embodiment of the present invention.
Figure 1B:
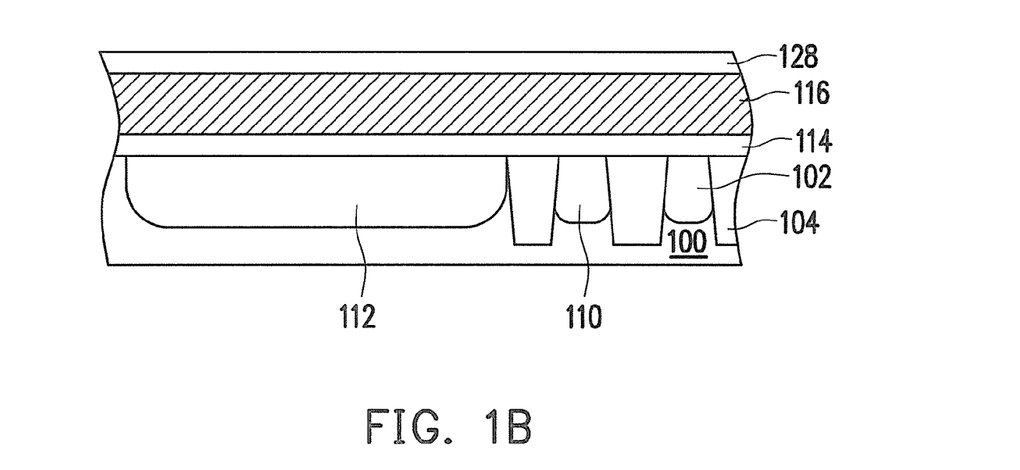
FIG. 1B is a cross-sectional view of FIG. 1A along an A-A' line.
Figure 1C:
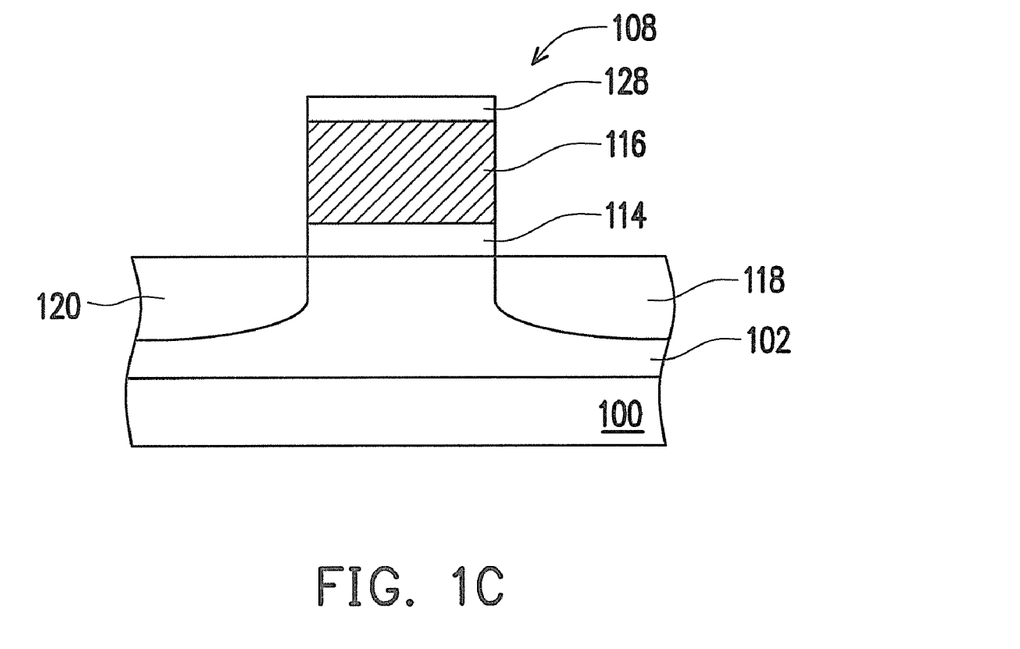
FIG. 1C is a cross-sectional view of FIG. 1A along a B-B' line.
Figure 1D:
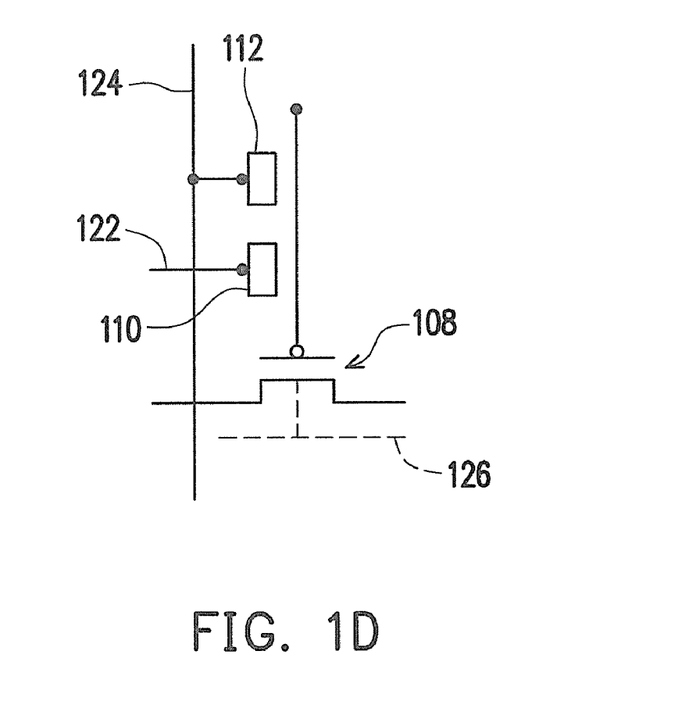
FIG. 1D is a simplified circuit diagram of a single-polysilicon layer non-volatile memory cell according to an exemplary embodiment of the present invention.

A single-polysilicon layer non-volatile memory of the present invention is formed by a memory cell array including a plurality of memory cells arranged in rows/columns. First, the memory cell of the present invention is described. FIG. 1A is a top view of a single-polysilicon layer non-volatile memory cell according to an exemplary embodiment of the present invention. FIG. 1B is a cross-sectional view of FIG. 1A along an A-A' line. FIG. 1C is a cross-sectional view of FIG. 1A along a B-B' line. FIG. 1D is a simplified circuit diagram of a single-polysilicon layer non-volatile memory cell according to an exemplary embodiment of the present invention.

Referring to FIG. 1A to FIG. 1D, the non-volatile memory cell is, for example, disposed on a substrate 100, and the substrate 100 is, for example, a silicon substrate. A well region 102 is disposed in the substrate 100, and an isolation structure 104 is disposed in the substrate to define active regions 106a, 106b and 106c. The isolation structure 104 is, for example, a shallow trench isolation structure or a field oxide layer.

The non-volatile memory cell, for example, includes a floating gate transistor 108, a program gate 110 and a control gate 112.

The floating gate read transistor 108 is, for example, disposed on the substrate 100. The floating gate read transistor 108, for example, includes a tunneling dielectric layer 114, a floating gate 116, a source region 118 and a drain region 120. The floating gate read transistor 108 is, for example, a P-channel transistor.

The floating gate 116 is, for example, disposed on the substrate 100, and crosses the active regions 106a, 106b and 106c. A material of the floating gate 112 is, for example, p-type impurity doped polysilicon or n-type impurity doped polysilicon.

The tunneling dielectric layer 114 is, for example, disposed between the floating gate 116 and the substrate 100, and a material of the tunneling dielectric layer 114 is, for example, silicon oxide. In current standard 0.18 um 1.8V/3.3V technology, the thickness of tunneling dielectric layer is around 70 Å.

The source region 118 and the drain region 120 are, for example, respectively disposed in the substrate 100 at two sides of the floating gate 116. Moreover, the source region 118 and the drain region 120 are located in the active region 106a. Since the floating gate transistor 108 is a P-channel transistor, the source region 118 and the drain region 120 are p-type doped diffusion region.

The program gate 110 is, for example, disposed in the substrate 100 under the floating gate 116 separated by the tunneling dielectric layer 114. Moreover, the program gate 110 is located in the active region 106b. The program gate 110 is, for example, formed by an N-type doped region (well region). The program gate 110, the tunneling dielectric layer 114 and the floating gate 116 form a capacitor node. Therefore, in the present embodiment, the N-type doped region (well region) located in the active region 106b is referred to as the program gate 110. A program line 122 is coupled to the program gate 110.

The control gate 112 is, for example, disposed in the substrate 100 under the floating gate 116 separated by the tunneling dielectric layer 114. Moreover, the control gate 112 is located in the active region 106c. The control gate 112 is, for example, formed by an N-type doped region (well region). The control gate 112, the tunneling dielectric layer 114 and the floating gate 116 form a capacitor node. During a program operation or an erase operation of the memory cell, a control voltage is applied to the N-type doped region (well region) located in the active region 106c, and the control voltage can be coupled to the floating gate 116 through this capacitor node. Therefore, in the present embodiment, the N-type doped well (well region) located in the active region 106c is referred to as the control gate 112. A control line 124 is coupled to the control gate 112.

Moreover, to perform a program operation, charges are injected to the floating gate 116 by coupling the N-type doped region (well region) located in the active region 106b and 106c with the program and control voltage, respectively according to a Fowler-Nordheim (F-N) tunneling effect.

Moreover, regarding the well region 102 in the active region 106a, during the erase operation, charges are expelled to the well region 102 from the floating gate 116 according to the F-N tunneling effect with large bias difference existing between the well region 102 and floating gate 116. Therefore, in the present embodiment, the well region 102 is referred to as an erase gate. An erase line 126 is coupled to the well region 102 in the active region 106a.

Moreover, a gate capacitive area (W*L) between the control gate 112 and the floating gate 116 is, for example, greater than a sum of a gate capacitive area (W*L) between the program gate 110 and the floating gate 116 and a gate capacitive area (W*L) between the active region 106a (the well region 102, and the erase gate) and the floating gate 116. Particularly, the gate capacitive area between the control gate 112 and the floating gate 116 is preferably 10 times greater than the sum of the gate capacitive area between the program gate 110 and the floating gate 116 and the gate capacitive area between the active region 106a (the well region 102, and the erase gate) and the floating gate 116. Namely, a coupling ratio between the control gate 112 and the floating gate 116 is preferably greater than a sum of a coupling ratio between the program gate 110 and the floating gate 116 and a coupling rate between the active region 106a (the well region 102, and the erase gate) and the floating gate 116. According to such design, during the operation, a voltage is generally applied to the control gate 112, so that the voltage of the control gate 112 can be mostly coupled to the floating gate 116 without any significant voltage dropping.

In the non-volatile memory of the present embodiment, since the program gate 110 and the control gate 112 are respectively an N-type well region, there is no need to have two stacked polysilicon layers to form the program gate and control gate. The non-volatile memory can be fabricated without changing a general complementary metal-oxide semiconductor fabrication process. Another reason to adopt the N-type well region is that we can use the positive voltage applied to the program gate 110 and the control gate 112 with electrical isolation from the P-type well or P-type substrate because there is a reversed bias junction existing between the N-type well and P-type well. No electrical isolation from the P-type substrate will be formed if we choose the P-type well as the program gate 110 and the control gate 112.

Further, a dielectric layer 128 is optionally disposed on the floating gate 116, for example. The material of the dielectric layer 128 is silicon oxide or silicon oxynitride, for example. In the present invention, the dielectric layer 128 is a film that serves as a self-aligned salicide block oxide (SAB) or a resistive protection oxide layer (RPO) in a logic process.

In order to guarantee the high quality of non-volatile memory cells, the dielectric layer 128 (a self-aligned salicide block oxide or a resistive protection oxide layer) is specially designed to add on top of floating gate 116. It eliminates not only the mechanical stress from inter layer dielectric (ILD) layer in subsequent process but also the silicide shorting from floating gate to silicided S/D (source or drain) junctions along the sidewall spacer. In this configuration, the charge retentivity is greatly enhanced.

In a semiconductor device process, the wafer is normally divided into a main device region and a peripheral circuit region. The devices in the main device region include memory devices, and the devices in the peripheral circuit region are logic devices, for example. In general, the electrical characteristics of the devices in the main device region and the devices in the peripheral circuit region are different. Therefore, a silicide process is normally performed after forming the devices so as to form silicide layers on the gate layers and the source/drain regions for reducing device resistance. However, before performing the silicide process, a film (the dielectric layer 128) is employed to cover those areas that need not be exposed to the silicide reaction. Because, the dielectric layer 128 (a self-aligned salicide block oxide or a resistive-protective oxide) commonly used in a logic process is directly used to cover the floating gate, the non-volatile memory of the present invention can be fabricated without changing the conventional CMOS process. In addition, the integration of memory devices is increased and the memory devices do not occupy additional space or additional masking layers.

Moreover, in the non-volatile memory of the present embodiment, it is unnecessary to set a select transistor, so that a size of the memory cell can be further reduced.

In addition, in the non-volatile memory of the present embodiment, the program gate 110, the control gate 112 and well region 102 are respectively disposed in the substrate 100 under the floating gate 116 separated by the tunneling dielectric layer 114, so that during the program operation and the erase operation, charges are injected in and expelled out through different regions of the tunneling dielectric layer 114, so as to increase reliability of the non-volatile memory after certain program/erase stresses.

Figure 2:
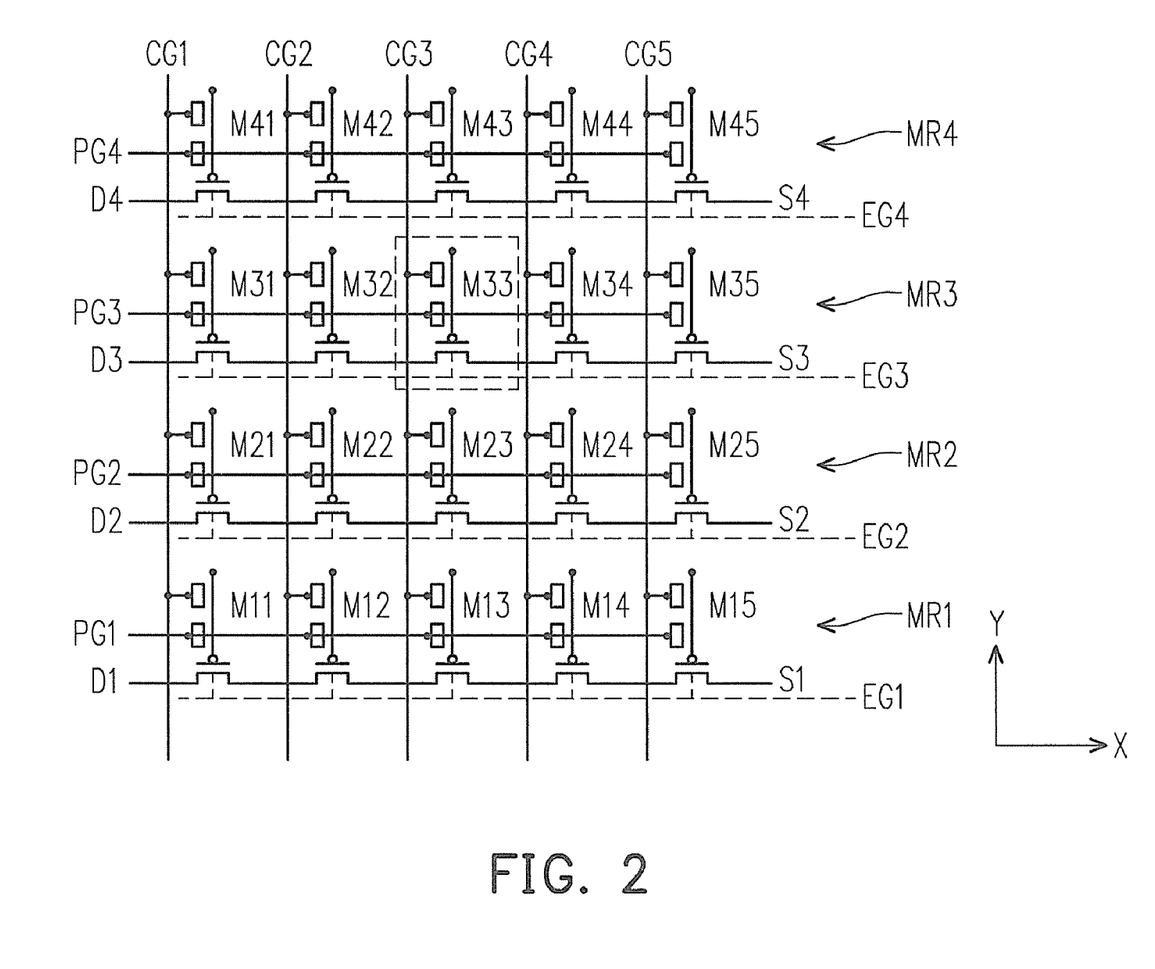
FIG. 2 is a simplified circuit diagram of a single-polysilicon layer non-volatile memory array according to an exemplary embodiment of the present invention.

FIG. 2 is a simplified circuit diagram of a single-polysilicon layer non-volatile memory array according to an exemplary embodiment of the present invention.

Referring to FIG. 2, the non-volatile memory of the present embodiment is, for example, formed by a plurality of memory cell arrays. In the present embodiment, the memory cell array formed by 4×5 memory cells is taken as an example for description, though a number of the memory cells used for consisting the memory cell array can be changed according to an actual requirement. For example, 64, 256 and 512 memory cells are used to consist the memory cell array. In FIG. 2, an X-direction is defined as a row direction and a Y-direction is defined as a column direction.

The memory cell array includes a plurality of memory cell rows MR1-MR4, a plurality of program lines PG1-PG4, a plurality of control lines CG1-CG5, and a plurality of erase lines EG1-EG4.

The memory cell rows MR1-MR4 include a plurality of memory cells M11-M45 connected in series. For example, the memory cell row MR1 is formed by a plurality of the memory cells M11-M15 connected in series, the memory cell row MR2 is formed by a plurality of the memory cells M21-M25 connected in series, . . . , and the memory cell row MR4 is formed by a plurality of the memory cells M41-M45 connected in series. More particularly, one source/drain region of memory cell M12 is connected to one source/drain region of memory cell M11. The other source/drain region of memory cell M12 is connected to one source/drain region of memory cell M13 and so on. It is worthy noted that the connected source/drain region of M11 and M12 will be electrically isolated from other external power supply, and that means the source/drain regions disposed between memory cells in the memory cell row are all floating. Same boundary condition can be applied to the connected source/drain region of M12 and M13. And all the rest memory transistors can be arranged in the same kind manners and similar connections. Each of the memory cell M11-M45 has the structure shown in FIGS. 1A-1D, and detailed description thereof is not repeated.

The program lines PG1-PG4 are disposed on the substrate in parallel and extended along the row-direction (the X-direction), and are respectively coupled to the program gates of the memory cells of the same row. For example, the program line PG1 is coupled to the program gates of the memory cells M11-M15 in the same row, the program line PG2 is coupled to the program gates of the memory cells M21-M25 in the same row, . . . , and the program line PG4 is coupled to the program gates of the memory cells M41-M45 in the same row.

The control lines CG1-CG5 are disposed on the substrate in parallel and extended along the column-direction (the Y-direction), and are respectively coupled to the control gates of the memory cells of the same column. For example, the control line CG1 is coupled to the control gates of the memory cells M11-M41 in the same column, the control line CG2 is coupled to the control gates of the memory cells M12-M42 in the same column, . . . , and the control line CG5 is coupled to the control gates of the memory cells M15-M45 in the same column.

The erase lines EG1-EG4 are respectively formed by well regions under each of the memory cell rows and are extended along the row-direction (the X-direction). For example, the erase line EG1 is coupled to the well regions (erase gates) under the floating gate transistors of the memory cells M11-M15 in the same row, the erase line EG2 is coupled to the well regions (erase gates) under the floating gate transistors of the memory cells M21-M25 in the same row, . . . , and the erase line EG4 is coupled to the well regions (erase gates) under the floating gate transistors of the memory cells M41-M45 in the same row.

Moreover, drain regions D1-D4 and source regions S1-S4 at two sides of the memory cell rows MR1-MR4 can be respectively connected to a transistor for utilization during the memory operation.

In the non-volatile memory of the present embodiment, it is unnecessary to set the select transistors in the memory cells, and the memory cells are connected in series, so that the size of the memory cell array can be reduced.

An operating method of the non-volatile memory of the present invention is described below, and the operating method includes operation modes of program, erase and read, etc. An exemplary embodiment is provided below to describe the operating method of the non-volatile memory of the present invention, though the present invention is not limited thereto. The memory cell M33 is taken as an example for description.

Figure 3A:
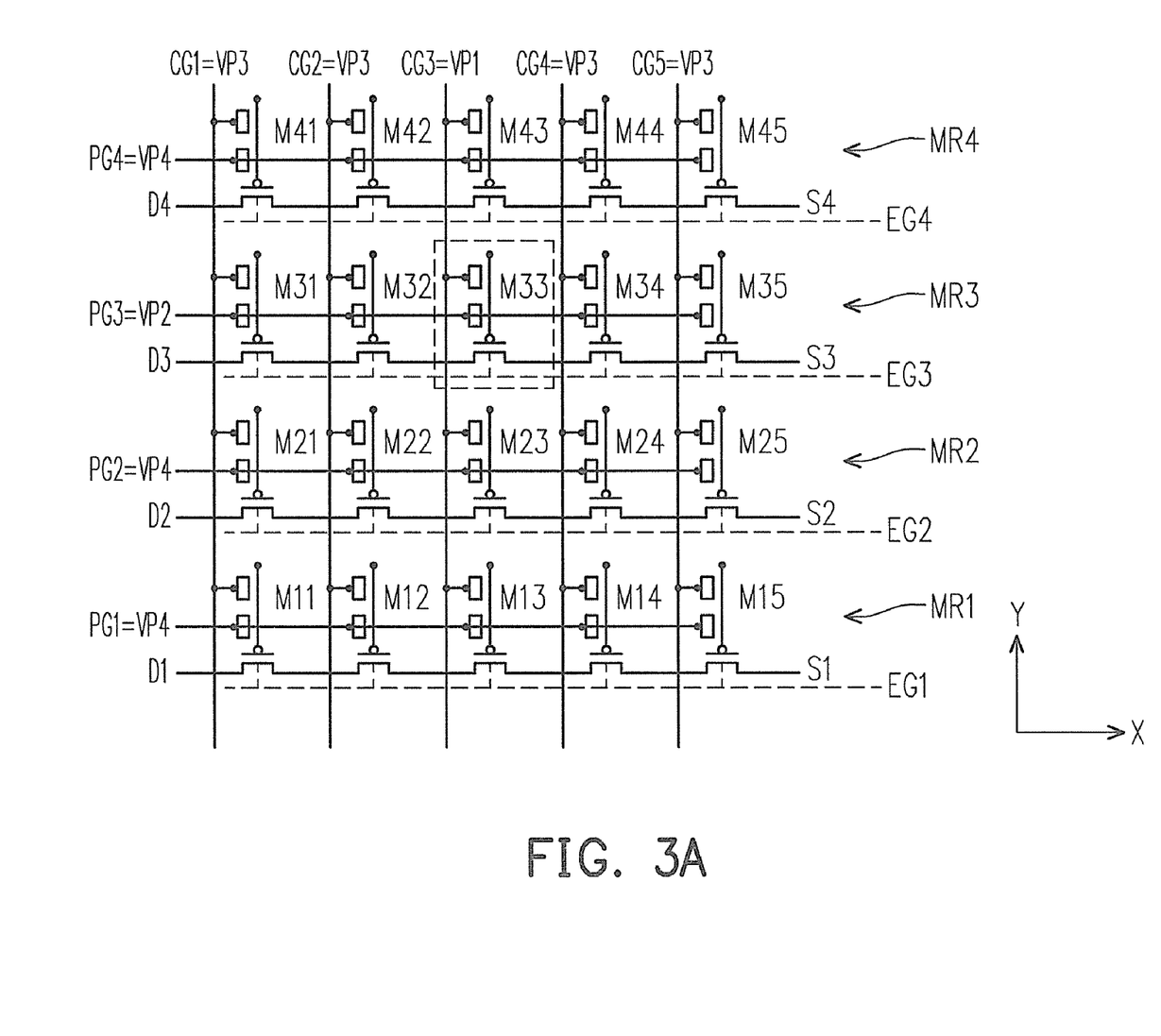
FIG. 3A is a schematic diagram illustrating an example of a program operation of a memory array.
Figure 3B:
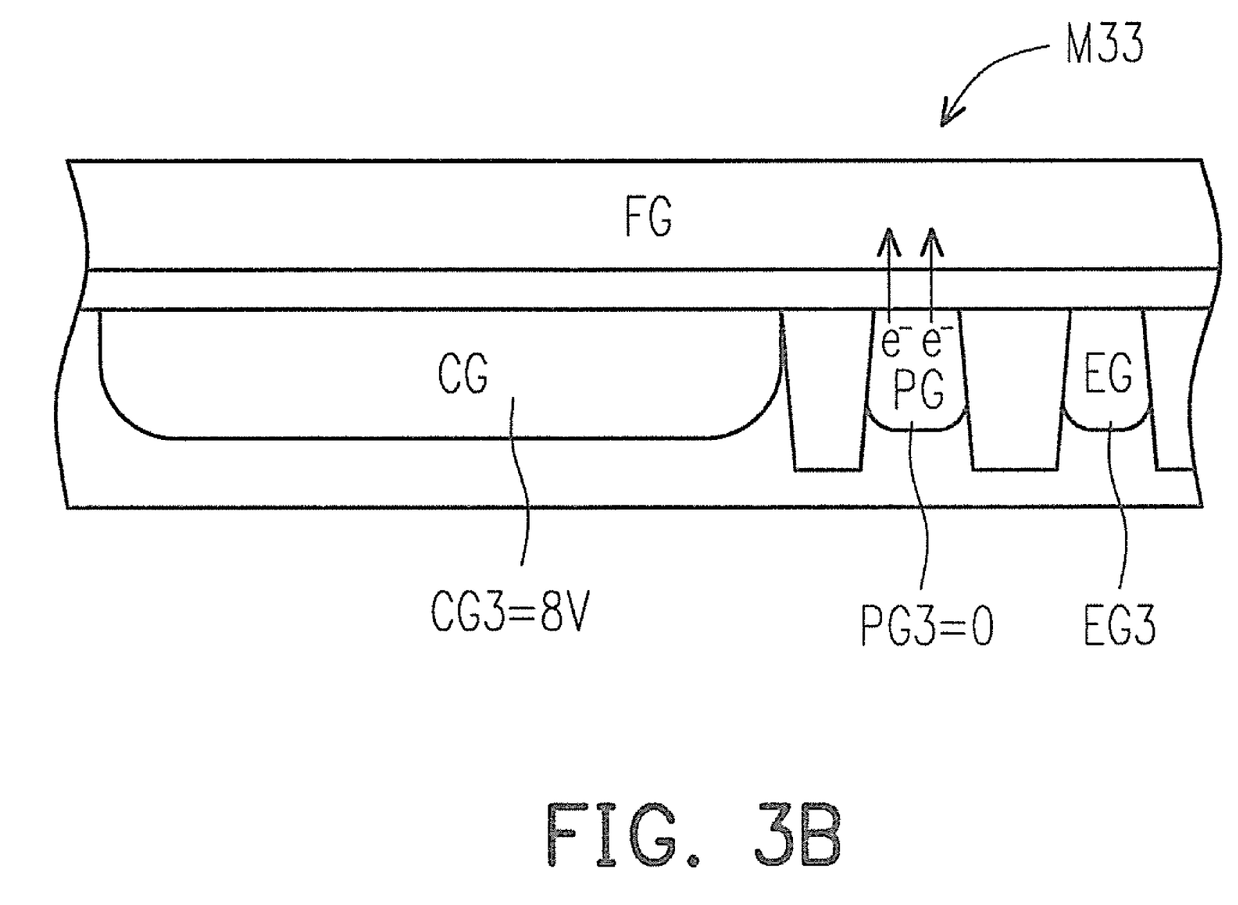
FIG. 3B is a cross-sectional view of a selected memory cell M33 during a program operation.

FIG. 3A is a schematic diagram illustrating an example of a program operation of a memory array. FIG. 3B is a cross-sectional view of the selected memory cell M33 during the program operation.

Referring to FIG. 3A, when a program operation is performed to the selected memory cell M33 of the memory cell row MR3, a voltage Vp1 is applied to the selected control line CG3 coupled to the selected memory cell M33, and a voltage Vp2 is applied to the selected program line PG3 coupled to the selected memory cell M33. Wherein a voltage difference between the voltage Vp1 and the voltage Vp2 is great enough to cause the F-N tunneling effect, so that charges are injected to the floating gate FG from the program gate PG. In the present embodiment, the voltage difference between the voltage Vp1 and the voltage Vp2 is, for example, 8-12 volts for 70 Å tunneling dielectric thickness, wherein the voltage Vp1 is, for example, about 8 volts, and the voltage Vp2 is, for example, about 0 volt.

Moreover, a voltage Vp3 is applied to the other unselected control lines CG1, CG2, CG4 and CG5, and a voltage Vp4 is applied to the other unselected program lines PG1, PG2 and PG4. A voltage difference between the voltage Vp3 and the voltage Vp4 is not great enough to cause the F-N tunneling effect for program inhibition. In the present embodiment, the voltage Vp3 is half of Vp1, for example, about 4 volts, and the voltage Vp4 is also half of Vp1, for example, about 4 volts.

A pre-determined voltage of 4 volts can be applied to the erase lines EG1-EG4 to avoid un-wanted program disturbance.

As shown in FIG. 3B, when a program operation is performed to the selected memory cell M33, the 8 volts voltage applied to the control line CG3 (the control gate CG) is mostly coupled to the floating gate FG, and a large electric field is established between the floating gate FG and the program gate PG (0 volt), so that the charges can be attracted and entering the floating gate FG from the program gate PG according to the F-N tunneling effect. Moreover, as described above, the coupling ratio between the control gate CG and the floating gate FG is greater than the sum of the coupling ratio between the program gate PG and the floating gate FG and the coupling ratio between the erase gate EG and the floating gate FG. Under such kind of arrangement, the control gate voltage CG3 can be mostly coupled to the floating gate FG to establish sufficient bias difference for F-N tunneling effect.

During the above program operation, regarding the other unselected memory cells M13, M23 and M43 sharing the control line CG3 with the selected memory cell M33, since a voltage difference between the voltage (4 volts) applied to the unselected program lines PG1, PG2 and PG4 coupled to the unselected memory cells M13, M23 and M43 and the voltage (8 volts) applied to the selected control line CG3 is not great enough to cause the F-N tunneling effect (only 4 volts bias difference when compared to 8 volts bias difference setup in memory cell M33), programming of the unselected memory cells M13, M23 and M43 is prevented and inhibited.

During the above program operation, regarding the other unselected memory cells M31, M32, M34 and M35 sharing the program line PG3 with the selected memory cell M33, since a voltage difference between the voltage (4 volts) applied to the selected program line PG3 and the voltage (4 volts) applied to the unselected control lines CG1, CG2, CG4 and CG5 coupled to the unselected memory cells M31, M32, M34 and M35 is not great enough to cause the F-N tunneling effect (only 0 volt bias difference in this case when compared to 8 volts bias difference setup in memory cell M33), programming of the unselected memory cells M31, M32, M34 and M35 is prevented.

During the program operation of the non-volatile memory of the above embodiment, though a single memory cell in the memory cell array is taken as a unit to perform the program operation, during the program operation of the non-volatile memory of the present invention, a byte, a section and a block can also be taken as a unit for encoding through controlling of the control lines and the program lines.

Figure 4A:
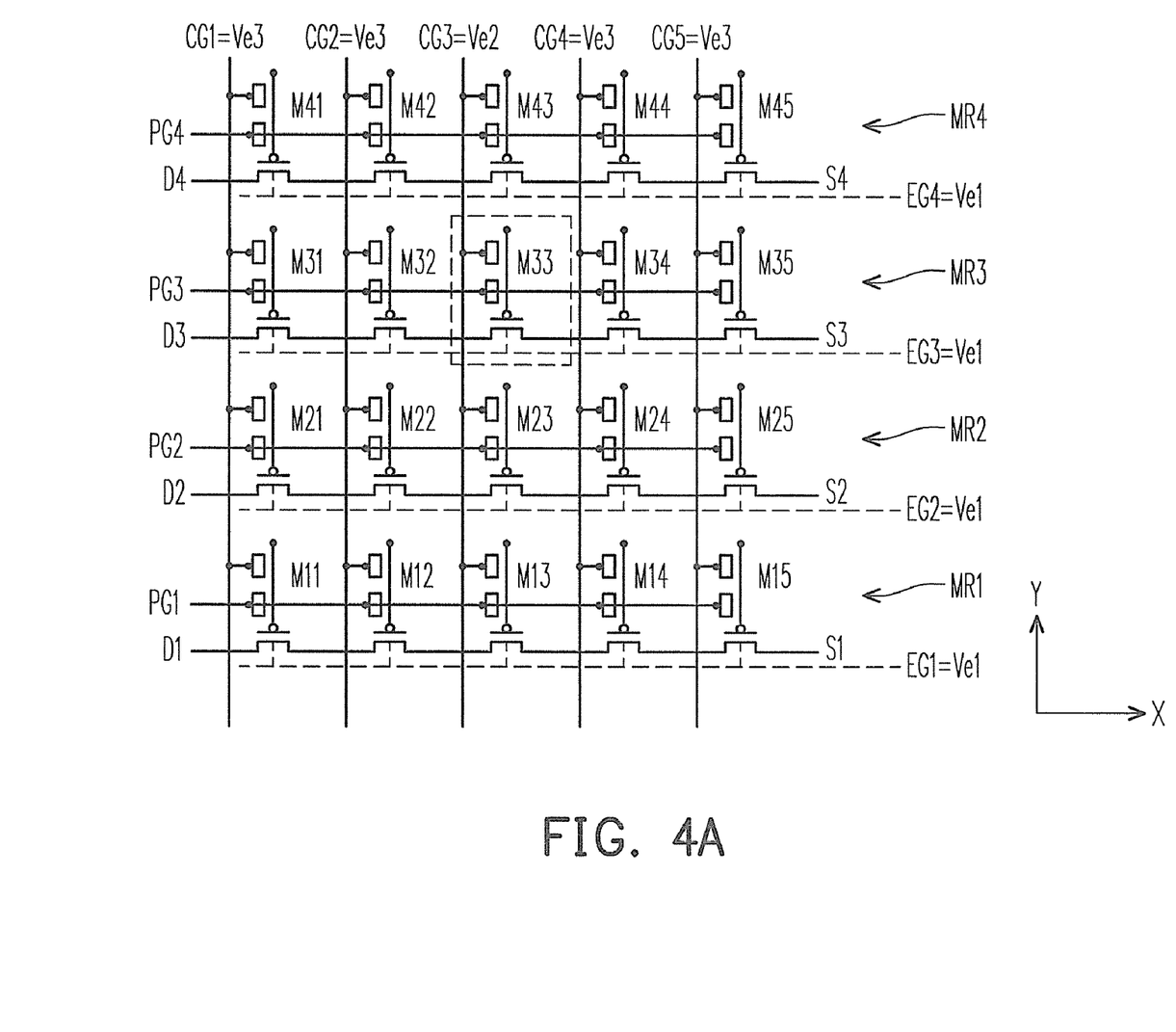
FIG. 4A is a schematic diagram illustrating an example of an erase operation of a memory array.
Figure 4B:
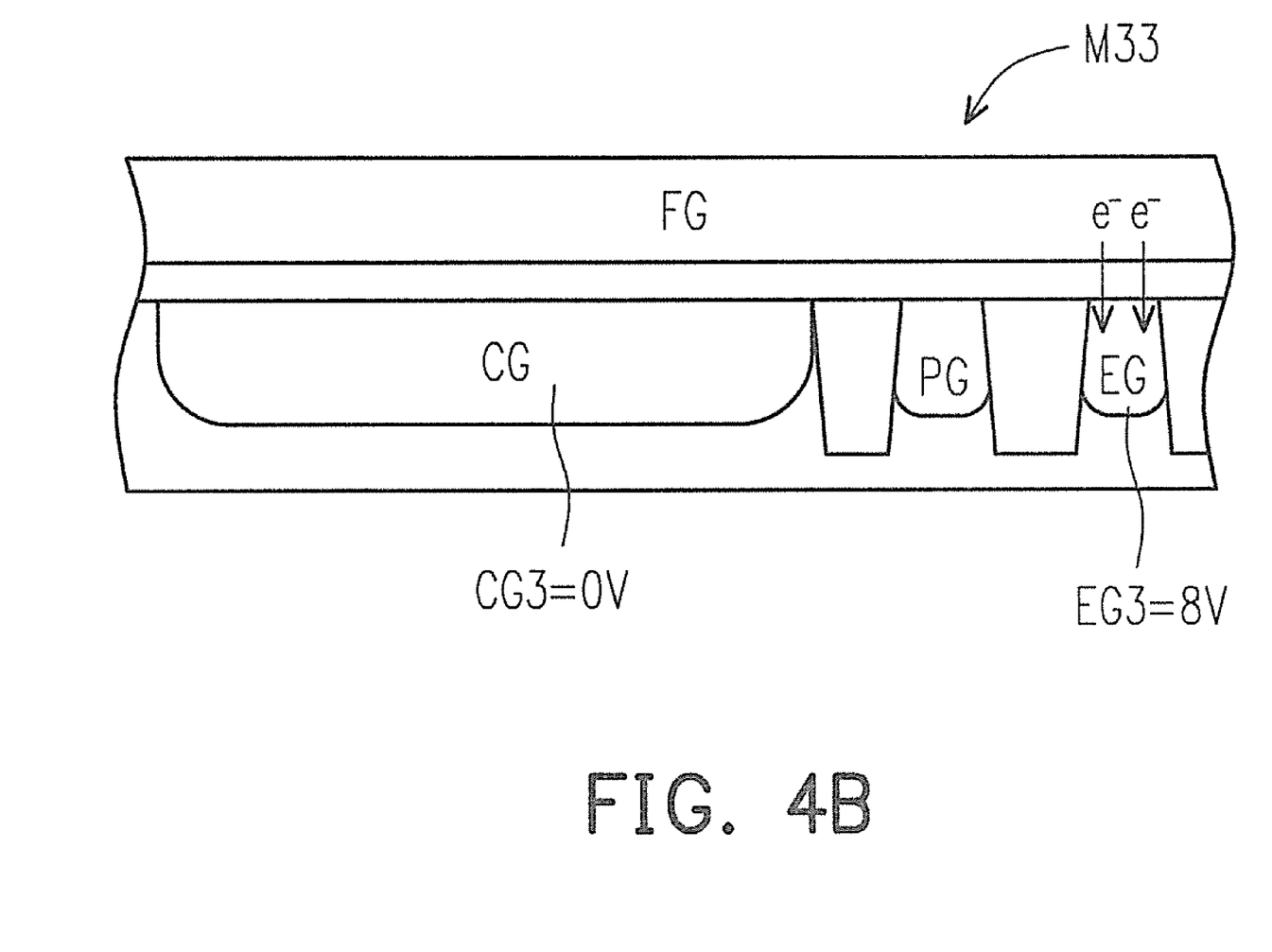
FIG. 4B is a cross-sectional view of a selected memory cell M33 during an erase operation.

FIG. 4A is a schematic diagram illustrating an example of an erase operation of a memory array. FIG. 4B is a cross-sectional view of the selected memory cell M33 during the erase operation. Erasing of a column of memory cells M13, M23, M33 and M43 sharing the control line CG3 is taken as an example to describe the erase operation of the present embodiment.

Referring to FIG. 4A, when the erase operation is performed to the selected memory cell M33 of the memory cell row MR3, a voltage Ve1 is applied to all of the erase lines EG1-EG4, and a voltage Ve2 is applied to the selected control line CG3 coupled to the selected memory cells M13, M23, M33 and M43. Under such kind of arrangement, the control gate voltage Ve2 can be mostly coupled to the floating gate FG through the selected control line CG3 to establish sufficient bias difference for F-N tunneling effect. Wherein a voltage difference between the voltage Ve1 and the voltage Ve2 is great enough to cause the F-N tunneling effect, so that charges are expelled to the erase gates EG from the floating gates FG. In the present embodiment, the voltage difference between the voltage Ve1 and the voltage Ve2 is, for example, 8-12 volts, wherein the voltage Ve1 is, for example, about 8 volts, and the voltage Ve2 is, for example, about 0 volt.

Moreover, a voltage Ve3 is applied to the other unselected control lines CG1, CG2, CG4 and CG5. In the present embodiment, the voltage Ve3 is, for example, about 4 volts. A voltage difference between the voltage Ve1 and the voltage Ve3 is not great enough to cause the F-N tunneling effect (only 4 volt bias difference in this case when compared to 8 volts bias difference setup in memory cells M13, M23, M33 and M43).

A pre-determined voltage of 4 volts can be applied to the program lines PG1-PG4 to avoid un-wanted erase disturbance.

As shown in FIG. 4B, when the selected memory cell M33 (the memory cells M13, M23, M33 and M43) is erased, the 0 volt voltage applied to the control line CG3 (the control gate CG) is mostly coupled to the floating gate FG, and a large electric field is established between the floating gate FG and the erase gate EG (8 volts), so that the charges can be expelled to the erase gate EG from the floating gate FG according to the F-N tunneling effect. Moreover, as described above, the coupling ratio between the control gate CG and the floating gate FG is much greater than the sum of the coupling ratio between the program gate PG and the floating gate FG and the coupling ratio between the erase gate EG and the floating gate FG.

During the above erase operation, since a voltage difference between the voltage (8 volts) applied to the erase lines EG1-EG4 and the voltage (4 volts) applied to the unselected control lines CG1, CG2, CG4 and CG5 is not great enough to cause the F-N tunneling effect, erasing of the unselected memory cells is prevented and inhibited.

During the erase operation of the non-volatile memory of the above embodiment, though a whole column of memory cells in the memory cell array is taken as a unit to perform the erase operation, during the erase operation of the non-volatile memory of the present invention, a single memory cell, a byte, a section and a block can also be taken as a unit for erasing through controlling of the control lines and the erase lines.

Figure 5:
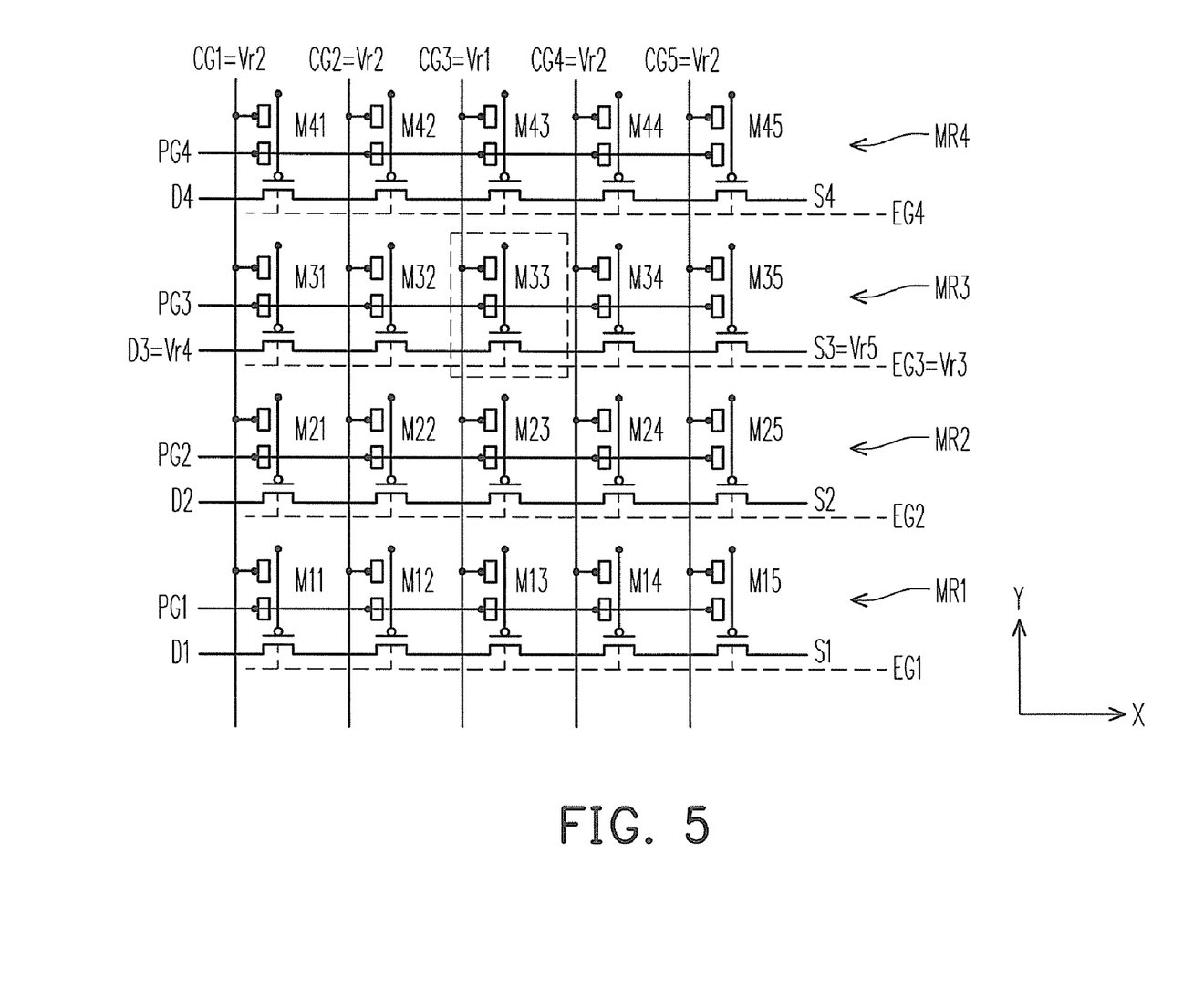
FIG. 5 is a schematic diagram illustrating an example of a read operation of a memory array.

FIG. 5 is a schematic diagram illustrating an example of a read operation of a memory array.

Referring to FIG. 5, during the read operation, a voltage Vr1 is applied to the selected control line CG3 coupled to the selected memory cell M33, a voltage Vr2 is applied to the other unselected control lines, a voltage Vr3 is applied to the selected erase line EG3 coupled to the selected memory cell M33, a voltage Vr4 is applied to the drain region D3 and a voltage Vr5 is applied to the source region S3, so as to read the selected memory cell M33.

In the present embodiment, the voltage Vr1 is about 2.5 volts, the voltage Vr2 is about 0 volt, the voltage Vr3 is about 2.5 volts, the voltage Vr4 is about 2.5 volts, the voltage Vr5 is about 0 volt. The coupled gate voltage of the memory cells M31, M32, M34 and M35 are very close to 0 volt (through the assistance of Vr2 is 0V) with the N-well biased to 2.5 volts (Vr3 is set to 2.5 volts). Since the read transistors are p-channel devices, the channel for M31, M32, M34 and M35 will be turn-on. A current path is formed between drain region D3 and the source region S3. The channel current flowing from M31 to M35 or not will be dependent on the data information stored in read transistor M33. This is due to no bias difference between the gate and well bias for read transistor M33. If the charges (electrons here) are stored in floating gate of memory cell M33, the channel for read transistor of M33 will be turn on also. Then the whole channel current will start to flow from M31 to M35. On the other hand, if there are no charges stored in floating gate of memory cell M33, the channel for read transistor of M33 will be in shut down mode. No channel current flows from M31 to M35.

In case of the above biases, digital information stored in the memory M33 can be determined by detecting a channel read current of the memory cell.

In the above operating method, since the program operation and the erase operation are performed according to the F-N tunneling effect, during the program operation and the erase operation, charges are injected in and expelled out through different regions of the tunneling dielectric layer, so as to increase reliability of the non-volatile memory.

In the above operating method, since the program operation and the erase operation are performed according to the F-N tunneling effect, influence of a short-channel effect can be reduced. In other words, lengths of the floating gate transistors can be reduced to increase integrity of the devices without aggravating the short-channel effect. Moreover, during the program operation, the F-N tunneling effect with relatively high electron injection efficiency is used, so that a memory cell current is reduced and an operation speed is increased. Since the program operation and the erase operation are all performed according to the F-N tunneling effect, a current consumption is relatively small, which avails effectively reducing a power consumption of the whole chip.

In summary, in the non-volatile memory and the operating method thereof, since it is unnecessary to set a select transistor in the memory cell, sizes of the memory cells can be reduced. Moreover, in the non-volatile memory of the present invention, the program gate, the control gate and the erase gate are respectively disposed in the substrate under the floating gate separated by the tunneling dielectric layer, and during the program operation and the erase operation, charges are injected in and expelled out through different regions of the tunneling dielectric layer, so as to increase reliability of the non-volatile memory.

Moreover, in the non-volatile memory of the present invention, since the program gate and the control gate are respectively an N-type well region, the non-volatile memory can be fabricated without changing a general complementary metal-oxide semiconductor fabrication process.

In addition, in the non-volatile memory of the present invention, the F-N tunneling effect can be used to perform the program operation and the erase operation, so that memory cells are less affected by a short-channel effect, so as to reduce an operation voltage and reduce a device size.

Moreover, in the operating method of the non-volatile memory of the present invention, a single memory cell, a byte, a section and a block can also be taken as a unit to perform the program operation and the erase operation through controlling of the control lines, the program lines and the erase lines.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A single-polysilicon layer non-volatile memory, comprising:
   a plurality of memory cell rows, disposed on a substrate to form a memory cell array, each of the memory cell rows comprising a plurality of memory cells connected in series, and each of the memory cells comprising:
      a floating gate transistor, comprising a floating gate and a tunneling dielectric layer disposed between the floating gate and the substrate; and
      a program gate and a control gate, respectively disposed in the substrate under the floating gate separated by the tunneling dielectric layer;
   a plurality of program lines, respectively coupled to the program gates of the memory cells of a same row;
   a plurality of control lines, respectively coupled to the control gates of the memory cells of a same column; and
   a plurality of erase lines, respectively formed by a well region under each of the memory cell rows,
   an isolation structure, disposed in the substrate to define a first active region, a second active region and a third active region, and the floating gate crossing the first active region, the second active region and the third active region,
   wherein a source region and a drain region of the floating gate transistor are respectively disposed in the first active region of the substrate located at two sides of the floating gate, the program gate is disposed in the second active region, the control gate is disposed in the third active region, the floating gate transistor is a P-channel transistor, and the program gate and the control gate are respectively an N-type well region.

2. The non-volatile memory as claimed in claim 1, wherein a gate capacitive area between the control gate and the floating gate is greater than a sum of a gate capacitive area between the program gate and the floating gate and a gate capacitive area between the first active region and the floating gate.

3. The non-volatile memory as claimed in claim 2, wherein the gate capacitive area between the control gate and the floating gate is 10 times greater than a sum of the gate capacitive area between the program gate and the floating gate and the gate capacitive area between the first active region and the floating gate.

4. The non-volatile memory as claimed in claim 1, wherein source/drain regions disposed between memory cells in the memory cell row are all floating.

5. The non-volatile memory as claimed in claim 1, wherein the program lines are arranged perpendicular to the control lines.

6. The non-volatile memory as claimed in claim 1, wherein the program lines are arranged parallel to erase lines.

7. The non-volatile memory as claimed in claim 1, further comprising a dielectric layer disposed on top of the floating gate to improve charge retention issue.

8. The non-volatile memory as claimed in claim 1, wherein the dielectric layer is a self-aligned salicide block oxide (SAB) or a resistive protection oxide layer (RPO).

9. An operating method of a single-polysilicon layer non-volatile memory, the non-volatile memory comprising a plurality of memory cell rows respectively comprising a plurality of memory cells coupled in series, each of the memory cells comprising a floating gate transistor comprising a floating gate and a tunneling dielectric layer disposed between the floating gate and a substrate, a program gate and a control gate respectively disposed in the substrate under the floating gate separated by the tunneling dielectric layer; a plurality of program lines respectively coupled to the program gates of the memory cells of a same row; a plurality of control lines respectively coupled to the control gates of the memory cells of a same column; and a plurality of erase lines respectively formed by a well region under each of the memory cell rows, and the operating method of the non-volatile memory comprising:
   applying a first voltage to a selected control line coupled to a selected memory cell and applying a second voltage to a selected program line coupled to the selected memory cell during a program operation, wherein a voltage difference between the first voltage and the second voltage is great enough to cause a Fowler-Nordheim (F-N) tunneling effect, so that charges enter to the floating gate from the program gate.

10. The operating method of the non-volatile memory as claimed in claim 9, wherein the voltage difference between the first voltage and the second voltage is about 8 volts to 12 volts.

11. The operating method of the non-volatile memory as claimed in claim 9, further comprising:
applying a third voltage to other unselected control lines and applying a fourth voltage to other unselected program lines during the program operation, wherein a voltage difference between the third voltage and the fourth voltage is not great enough to cause an F-N tunneling effect.

12. The operating method of the non-volatile memory as claimed in claim 9, further comprising:
applying a fifth voltage to the erase lines and applying a sixth voltage to the selected control line coupled to the selected memory cell during an erase operation, wherein a voltage difference between the fifth voltage and the sixth voltage is great enough to cause an F-N tunneling effect, so that charges are expelled to the erase lines from the floating gate.

13. The operating method of the non-volatile memory as claimed in claim 12, wherein the voltage difference between the fifth voltage and the sixth voltage is about 8 volts to 12 volts.

14. The operating method of the non-volatile memory as claimed in claim 12, further comprising:
applying a seventh voltage to other unselected control lines during the erase operation, wherein a voltage difference between the fifth voltage and the seventh voltage is not great enough to cause the F-N tunneling effect.

15. The operating method of the non-volatile memory as claimed in claim 9, further comprising:
applying an eighth voltage to the selected control line coupled to the selected memory cell, applying a ninth voltage to other unselected control lines, and applying a tenth voltage to the selected erase line coupled to the selected memory cell during a read operation, so as to read the selected memory cell.

* * * * *